United States Patent [19]

Thomas

[11] Patent Number: 5,065,453
[45] Date of Patent: Nov. 12, 1991

[54] ELECTRICALLY-TUNABLE BANDPASS FILTER

[75] Inventor: Gary D. Thomas, Lynchburg, Va.

[73] Assignee: General Electric Company, Lynchburg, Va.

[21] Appl. No.: 325,994

[22] Filed: Mar. 20, 1989

[51] Int. Cl.$^5$ .......................... H03H 7/01; H04B 1/10; H04B 1/16
[52] U.S. Cl. .................................. 455/286; 333/171; 333/176; 455/307; 455/339; 455/340
[58] Field of Search ................... 455/282, 284–287, 455/289, 290, 291, 292, 307, 338–340; 333/170–177

[56] References Cited

U.S. PATENT DOCUMENTS

| | | | |
|---|---|---|---|
| 3,223,944 | 12/1965 | Schroeder et al. | 333/176 |
| 3,704,434 | 11/1972 | Schlachter | 333/170 |
| 4,426,630 | 1/1984 | Folkmann | 333/174 |
| 4,570,288 | 4/1986 | Rinderle | 455/239 |
| 4,662,001 | 4/1987 | Cruz et al. | 455/340 |
| 4,876,739 | 10/1989 | Ma et al. | 455/266 |

Primary Examiner—Curtis Kuntz
Assistant Examiner—Chi H. Pham
Attorney, Agent, or Firm—Nixon & Vanderhye

[57] ABSTRACT

A bandpass filter is disclosed which may be used in a superheterodyne receiver in front of the first mixer. The bandpass filter provides a narrow front end filter which is tuned automatically as the local oscillator frequency is changed. In the present exemplary embodiment, a series tuned reflective notch filter is coupled to a node of a balanced resistive bridge in such a manner that the tuned circuit presents a short circuit to the node at the filter's resonant frequency to thereby assure a maximum transfer of signal from the input to the output of the circuit at a desired frequency. At all other frequencies, the series tuned reflective notch filter will present essentially an open circuit across the node of the resistive bridge so that the node is balanced and no transmission occurs. The inclusion of the series reflective notch filter thereby produces a bandpass characteristic from the circuit input to output. By using back to back varactor diodes in the reflective notch filter, the center frequency of the passband can be changed by changing the tuning voltage applied to the varactors. In the configuration of the present invention, the varactor diodes are protected from high signal levels which are not within the narrow passband of the filter. For this reason, the filter is inherently less susceptible to the generation of intermod products than filters of a conventional design.

30 Claims, 1 Drawing Sheet

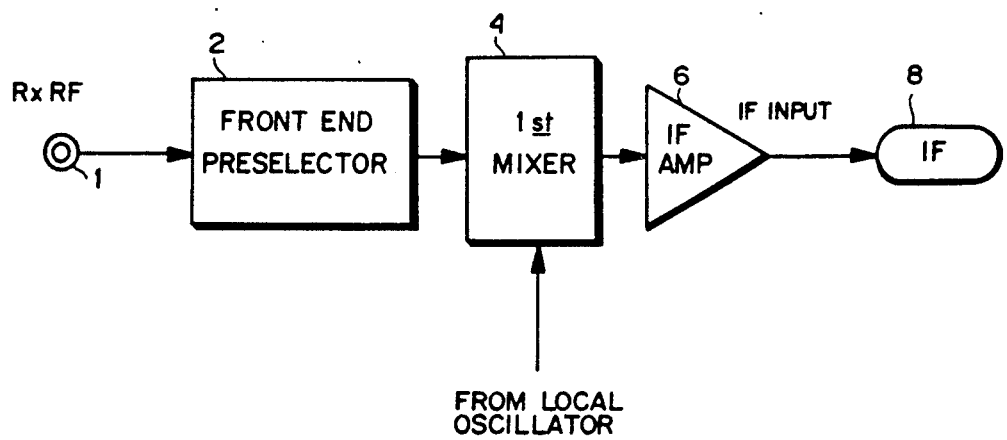
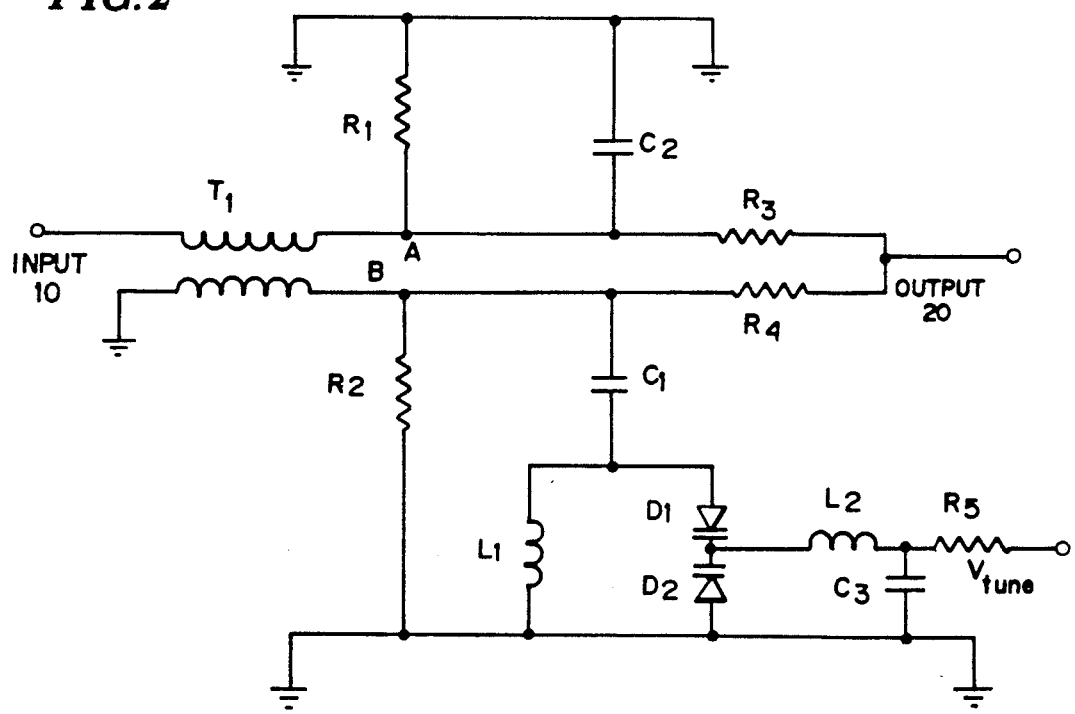

ELECTRICALLY-TUNABLE BANDPASS FILTER

FIELD OF THE INVENTION

This invention relates generally to bandpass filters. More particularly, the invention relates to an electrically-tunable bandpass filter that may be advantageously utilized as a narrow RF bandpass filter in a radio receiver which may be tuned automatically by varying a single control voltage.

BACKGROUND AND SUMMARY OF THE INVENTION

A radio receiver is designed to be extremely sensitive to responding to the desired signals to which it is tuned and to rejecting signals to which it is not tuned. Superheterodyne radio receivers typically achieve the bulk of their selectivity using narrow fixed-tuned intermediate frequency (If) filters. These filters reject undesired signals which may be present at RF frequencies which are close to the desired or "tuned" frequency. Such narrow If filters do not prevent the reception of undesired signals which are converted in a mixer directly into the If passband. Such undesired signals which are not rejected by the radio receiver filters create spurious responses such as image, half If and intermodulation (intermod) distortion.

These spurious responses may be generated in part due to the operation of the mixer in which various mixing products are generated, one of which is at the desired If frequency. One approach to eliminating such spurious responses is to use bandpass filters to prevent undesired signals from reaching the mixer in the superheterodyne radio receiver.

In the past, it was common practice to use a very narrow RF bandpass filter to prevent such undesired signals from reaching the mixer. Such "front end selectivity" was effective at eliminating most spurious responses, but the resulting receiver could only be operated over a very narrow band of desired receive frequencies without retuning the narrow RF filter. Thus, although narrow RF bandpass filters are effective in eliminating, for example, image and half If spurious responses, such prior art filters are limited to receiving a narrow band of frequencies and cannot be reconfigured automatically to receive signals over a wide frequency band.

Many modern day receivers utilize a much wider front end filtering system designed to pass the entire band of frequencies to which the receiver may be tuned (e.g., 150-174 MHz for a particular band used in the land mobile radio service). By careful design and proper selection of the If frequency, such a wideband filter can be designed to provide adequate protection from image and half If spurious responses. However, a wideband front end filtering system greatly increases the incidence of interpod distortion in the receiver by allowing a much larger number of in-band signals to reach the mixer.

Such an intermod spurious response is created when two or more undesired signals reach a non-linear element in the receiver such as the first mixer and combine to create a product that is directly on channel. Accordingly, such an on-channel signal cannot be readily distinguished as an undesired signal. Such undesired signals, which are mixed to produce an on-channel signal, may be so close to being on-channel themselves that they are difficult to reject with a wideband filter.

Various filter designs have been used heretofore to provide an automatically tuned front-end filter. Each such design, however, has significant disadvantages, particularly, for example, in regard to satisfying the needs of a mobile or portable radio communications system.

In broadcast receivers, a mechanically variable capacitor having two or more sections which are "ganged together" is used to tune the local oscillator and front end filter simultaneously. While such an approach may be acceptable in an AM broadcast radio receiver, where the bandwidths are very wide, this approach is not suitable for mobile radio receivers which have extremely narrow channel spacing and which cannot tolerate the poor frequency stability of such a mechanically tuned local oscillator. Thus, in a mobile radio receiver, if the filter detunes or the local oscillator drifts by any small amount due to such poor frequency stability, desired signals may not be received.

Another approach which heretofore has been utilized to provide an automatically tunable front end filter, uses multiple front end filters, each of which is tuned to a different frequency within the overall passband. Such a system includes control circuitry in the receiver which selects the appropriate filter based on the radio channel selected and switches it to the front end via, for example, a relay or a PIN diode switch. Each of the multiple front end filters is typically a narrow fixed tuned filter. In order to effectively cover a wide band of frequencies using such narrow filters, a large number of filters is required. Accordingly, such a design from a practical point of view is prohibitively costly, complex and bulky.

A further approach to providing an automatically tuned front end filter incorporates voltage variable capacitors (i.e., varactor diodes) as reactive elements in a single filter. A control voltage is applied to the varactor diodes to tune the filter to the desired receive frequency. This approach has heretofore typically utilized a reactively coupled resonator filter which generally has multiple sections that are tuned separately but which must "track" as the tuning voltage varies. Such a multiple section filter must have sections which have the same tuning response so that each section tunes in exactly the same way when the tuning voltage varies. To ensure that such "tracking" takes place in the proper fashion adds to the complexity of the filter. Additionally, although such a filter may be effective to reduce image and half If spurious responses, in such prior art tunable filters which incorporate varactor diodes, the diodes tend to be subjected to high RF levels at all frequencies and have the potential to generate intermod products themselves.

The present invention overcomes many of the above-mentioned problems associated with conventional radio receiver filters in superheterodyne radio receiver applications. The present invention provides a narrow front end filter which can be tuned automatically as the local oscillator frequency is changed. In this fashion, the present invention reduces the number of spurious responses in the radio receiver while still allowing it to tune automatically over the full range of the desired frequency band.

In this regard, it is noted that the tuning voltage is used to control a single point in the circuit of the exemplary embodiment of the present invention. The tuning voltage is input at the junction between two varactor diodes which are placed back to back to thereby provide more linear tuning of center frequency versus voltage while providing higher intermod immunity than would be available using a single varactor diode. Additionally, the need for "tracking" between multiple diode sections is avoided. In the present invention, the varactor diodes are significantly decoupled from high RF levels. This results in less voltage being coupled across the varactors, reducing the possibility of generating unwanted intermod products.

The electrically tuned bandpass filter of the present invention uses the signal isolating properties of a balanced resistive bridge to transform a series tuned reflective notch filter into a selective bandpass filter. While any directive device such as a directional coupler, ferrite circulator, Wilkinson splitter, etc., could be used to provide this transformation, the resistive bridge of the exemplary embodiment additionally operates to provide an apparent "Q multiplication" in the tuned circuit yielding a sharper selectivity curve.

In the present exemplary embodiment, the series tuned reflective notch filter is coupled to a node of the balanced resistive bridge in such a manner that the tuned circuit presents a short circuit to the node at the filter's resonant frequency to thereby assure a maximum transfer of signal from the input to the output of the circuit at a desired frequency. At all other frequencies, however, the series tuned reflective notch filter will present essentially an open circuit across the node of the resistive bridge so that the node is balanced and no transmission occurs. The inclusion of the series reflective notch filter thereby produces a bandpass characteristic from the circuit input to output.

By using varactor diodes in the reflective notch filter, the center frequency of the passband can be changed by changing the tuning voltage applied to the varactors. In the configuration of the present invention, the varactor diodes are protected from high signal levels which are not within the narrow passband of the filter. For this reason, the filter is inherently less susceptible to the generation of intermod products than filters of a conventional design.

BRIEF DESCRIPTION OF THE DRAWINGS

These as well as other objects and advantages of this invention will be better appreciated by reading the following detailed description of the presently preferred exemplary embodiment taken in conjunction with the accompanying drawings of which:

FIG. 1 is a block diagram of a portion of a radio receiver system in which the bandpass filter of the present invention may be advantageously utilized; and FIG. 2 is a schematic diagram of an exemplary embodiment of a bandpass filter in accordance with the present invention.

DETAILED DESCRIPTION OF THE DRAWINGS

The presently preferred application for the bandpass filter of the present invention is in a superheterodyne radio receiver. In such a radio receiver system, a portion of which is generally represented in FIG. 1, a radio frequency signal is received by antenna 1 and is coupled to front-end preselector 2.

The bandpass filter of the present invention, an exemplary embodiment of which is shown in Figure 2, may be disposed within front-end preselector 2 which comprises filters and other associated circuitry which set the sensitivity of the receiver. The preselector 2 serves to filter unwanted signals to prevent such signals from being input to the first mixer 4. Within preselector 2, a conventional wideband filter (not shown) is coupled to antenna 1. The output of the wideband filter is coupled to a conventional RF amplifier (not shown) whose output is coupled to input port 10 of the exemplary bandpass filter shown in FIG. 2. The output signal from output port 20 of the bandpass filter of the exemplary embodiment is coupled to mixer 4 shown in FIG. 1.

Mixer 4, as is conventional, heterodynes the local oscillator signal with the incoming signal to generate sum and difference signals. The output of the first mixer includes, for example, a difference output frequency which may be the intermediate frequency signal.

The output of mixer 4 is amplified by an intermediate frequency amplifier 6 which is tuned to amplify signals in the desired intermediate frequency range. The amplified intermediate frequency signal may, for example, then be coupled to the If processing subsystem 8 of the radio, where the signal is further filtered and amplified. The filtered and amplified signal may then be applied to a second mixer, where it is further down converted to form a second If-frequency signal. Thereafter, the signal of interest is detected via a conventional FM (or AM) detector. Such an If processing subsystem is conventional and forms no part of the present invention.

The bandpass filter of the exemplary embodiment of the present invention is shown in FIG. 2 and includes an input port 10 and an output port 20. Coupled to the input port is a transformer T1. Transformer T1 may, for example, be a wideband transmission line transformer which acts as a one-to-one transformer in order to isolate the ground to thereby create a floating ground. Thus, if a signal $V_1$ is input at port 10, instead of varying, for example, from 0 to $V_1$ volts at node A, the output signal from transformer T1 swings from $-V_1/2$ to $+V_1/2$ at node A and from $+V_1/2$ to $-V_1/2$ at node B.

The amplitude of the voltage variations with respect to ground are the same at nodes A and B but are 180 degrees out of phase. This amplitude being one half of the amplitude which would be present at A if B were grounded. The transformer T1 primary is coupled to node A, which is coupled to resistor R1, which in turn is coupled to ground. The primary of transformer T1 is also coupled to output 20 via resistor R3.

Node A and resistor R3 are also coupled to capacitor C2 (which compensates for stray capacitance as will be explained further below), which in turn is coupled to ground in parallel with resistor R1. Resistor R3 is also coupled to resistor R4 which is coupled to node B, which in turn is coupled to the grounded secondary coil of transformer T1. Node B is additionally coupled to resistor R2 which is also coupled to ground.

As will be explained in detail below, resistors R1, R2, R3 and R4 form a balanced resistive bridge. Coupled to node B of the balanced resistive bridge is a series tuned reflective notch filter.

In the exemplary embodiment shown in FIG. 2, the notch filter includes a capacitor C1 which is a small fixed capacitor which may, for example, be 1.5 picofarads. Capacitor C1 is coupled to inductor L1 (which may, for example, be an RF coil of 181 nH), which is also coupled to ground. Capacitor C1 is additionally coupled to the anode of varactor diode D1, whose cathode is coupled to the cathode of varactor diode D2, whose anode is coupled to ground. Diodes D1 and D2 may, for example be Motorola Model No. MMBV105G varactor diodes.

Varactor diodes D1 and D2 form a voltage variable capacitor which is parallel resonant with L1, at a frequency above the desired tuning frequency of the filter. Thus, at the desired frequency, the parallel combination of L1 and D1 and D2 appears to be a high value of inductance which can be varied by varying $V_{tune}$. This inductance in turn resonates with capacitor C1 to yield a low series impedance at the desired center frequency. $V_{tune}$ is coupled to the cathodes of varactor diodes D1 and D2 via resistor R5 and inductor L2 which are coupled to ground through capacitor C3.

Focusing on resistive bridge R1, R2, R3 and R4, as noted above, the signal at nodes A and B swings between $+V_1/2$ and $-V_2/2$ If the ratio of resistances R1 to R2 is chosen to be equal to the ratio of resistances R3 to R4, then the voltage developed from node A to ground across R1 will be the same as the voltage developed from node A to output 20 across R3. Similarly, the voltage from node B to ground across R2 will be the same as the voltage developed from node B to the output 20 across R4. In both cases the resulting voltage at output 20 is at ground potential. Under such conditions (ignoring for the moment the notch filter), there will be no output voltage at output port 20. Thus, by proper selection of resistors R1, R2, R3 and R4, to achieve a balanced resistive bridge, it is possible to prevent any output voltage from being developed at node 20, irrespective of the applied input voltage.

In the present exemplary embodiment, notch filter (C1, L1, D1 and D2) operates to disturb the balance effect of the resistive bridge, such that at a predetermined desired frequency an output signal begins to develop at output port 20. In this regard, the notch filter C1, L1, D1 and D2 operates as a reactive element which is placed across resistor R2 and serves to short out resistor R2 at a predetermined desired frequency. The notch filter C1, L1, D1 and D2 operates substantially as a short circuit for a narrow band of input frequencies and as an open circuit at all other frequencies.

With the resistor R2 shorted out at the particular frequency, the resistive bridge R1, R2, R3, and R4 is then out of balance and a signal appears at the output port 20. Thus, when the notch or band elimination filter C1, L1, D1 and D2 is utilized in conjunction with the resistive bridge network as shown in FIG. 2, a bandpass filter is created.

By coupling $V_{tune}$ to the notch filter at the cathodes of varactor diodes D1 and D2, the bandpass filter may be readily tuned. In this regard, the frequency at which an output signal is generated at output port 20 is determined by the series resonance of capacitor C1 with the equivalent inductance of L1 in parallel with varactor diodes D1 and D2. The resonant frequency may be changed by changing the tuning voltage $V_{tune}$ which operates to vary the capacitance of varactor diodes D1 and D2 to thereby change the series resonance frequency of the notch filter network.

Focusing back on the resistive bridge network R1, R2, R3 and R4, this network is comprised of resistors whose values have been chosen to minimize the insertion loss in the passband of the signal being transmitted from the input port 10 to output port 20. In this regard, resistor R1 may, for example, be 220 ohms, resistor R2 may, for example, be 1800 ohms, resistor R3 may, for example, be 27 ohms, and resistor R4 may, for example, be 220 ohms. R2 has been chosen to be a relatively large resistance value so that at resonance when the balance of the bridge is disrupted by notch filter C1, L1, D1 and D2, which presents a short circuit in parallel with R2, the residual resistance of the short circuit will be negligible in comparison with the resistance R2. In view of this particular choice of resistor values, capacitors C2 (which may, for example, be 15 picofarads) is necessary to compensate for stray capacitance which otherwise would impact one side of the resistive bridge more than the other side.

The resistor values identified above serve to maintain a 50 ohm input and output impedance in the passband of the filter. In this regard, when the series tuned notch filter presents a short circuit to node B, resistors R1, R3 and R4 are further chosen to simulate a matched 50 ohm Pi attenuator. Since nominal passband insertion loss is equal to the value of attenuation chosen, it is desirable to design for the lowest attenuation possible. The exemplary values for R1, R3 and R4 referred to above correspond to a matched 4.4 dB attenuator. Thus, the nominal insertion loss of the filter is 4.4. dB (the actual attenuation may exceed this due to additional stray losses in the circuit). The resulting impedance to ground from node B is 86 ohms compared to 25 ohms for a conventional 50 ohm bridge. This results in a potential 3.4 fold increase in loaded Q. It should be recognized that the exemplary 4.4. dB attenuator was chosen in the exemplary embodiment so the resistors could be implemented using standard chip resistors. By using nonstandard resistors and accurately trimming their values, even lower loss and higher apparent Q can be achieved.

Focusing now in more detail on the operation of FIG. 2, if an input signal $V_1$ is applied to input port 10, a differential signal is developed by transformer T1, such that $+V_2/2$ is applied to node A (and R1 and R3) and $-V_1/2$ is applied to node B (and R2 and R4). The signal input at port 10 is split into two paths. On one path the signal goes through resistor R1 to ground, through ground to resistor R2 to the bottom coil of transformer T1. On a second path the signal at node A goes through resistor R3 into resistor R4 and back through the bottom coil of transformer T1.

If the ratio of the resistances R1 to R2 is equal to the ratio of the resistances of R3 to R4, then the resistive bridge is talanced and no voltage is developed from output port 20 to ground.

The balance of the resistive bridge is disrupted by the notch filter formed by C1, L1, D1 and D2 at the resonant frequency of this notch filter circuit. The series resonance frequency for the notch filter is chosen to be the center frequency of the desired passband for the passband filter shown in FIG. 2. By appropriately choosing the values for C1, L1, D1 and D2, the notch filter can be designed to be very selective in disrupting the isolation from input port 10 to output port 20 to (i.e., cause this disruption to take place only for a selected narrow band of frequencies). By only permitting a very narrow band of frequencies to be transmitted from input port 10 to output port 20, the notch filter can thereby discriminate against undesired signals being passed from input port 10 to output port 20. Thus, signals which would tend to cause intermod problems or other spurious responses can be precluded from passing from input port 10 to output port 20.

The notch filter C1, L1, D1 and D2 is tuned by applying a DC voltage to the junction of varactor diodes D1 and D2. The applied DC voltage changes the reactance of varactor diodes D1 and D2 to thereby tune the notch filter. Inductor L2, resistor R5 and capacitor C3 serve to couple the DC voltage $V_{tune}$ into the junction of varactor diodes D1 and D2. Capacitor C3 serves to couple RF frequencies to ground to decouple the junction of D1 and D2 from the tuning voltage input port 30 for AC frequencies. As will be appreciated by those skilled in the art, other component configurations could be utilized to couple the DC voltage $V_{tune}$ to the junction of varactor diodes D1 and D2 as shown in FIG. 2. In this regard, L2, R5, C3 serves as a noise filter to keep noise signals away from the junction of D1 and D2. Other more elaborate noise filters could be utilized in place of L2, C3 and R5.

It is noted that although the balanced resistive bridge shown in FIG. 2 is the presently preferred device for isolating input port 10 from output port 20, the bridge may, if desired, be replaced with any directive device which has similar signal isolation properties. Thus, the present invention may be modified to incorporate any directive device such as a directional coupler, a ferrite circulator or Wilkinson splitter which have such signal isolating properties which may be used to transform a series tuned notch filter into a selective bandpass filter.

While the present exemplary embodiment has been described in conjunction with a heterodyne radio receiver, it should be recognized that the circuit shown in FIG. 2 may be advantageously utilized in conjunction with any application where there is a need for a bandpass filter. While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A bandpass filter comprising:
    an input port for receiving signals falling within a predetermined band of frequencies;
    an output port;
    means, coupled between said input port and said output port, for establishing a balanced condition in which input signals having a first set of frequencies within said predetermined band of frequencies applied to said input port fail to result in the generation of any output signal at said output port; and
    means, coupled to said means for establishing a balanced condition, for disrupting said balanced condition such that output signals having a second set of frequencies within said predetermined band of frequencies are passed to said output port.

2. A bandpass filter in accordance with claim 1 further including means, coupled to said input port, for isolating said input signal from ground.

3. A bandpass filter according to claim 2, wherein said means for isolating comprises a transformer.

4. A bandpass filter according to claim 1, wherein said means for establishing a balanced condition includes a resistive bridge coupled between said input port and said output port.

5. A bandpass filter in accordance with claim 1 wherein said input port is coupled to an unbalanced signal source.

6. A bandpass filter in accordance with claim 1, wherein said means for disrupting said balance includes notch filter means for presenting a substantially short circuit to signals within said second set of frequencies and for presenting a substantially open circuit to signals at frequencies outside said second set of frequencies.

7. A bandpass filter according to claim 1, wherein said means for disrupting includes a notch filter.

8. A bandpass filter in accordance with claim 1, wherein said means for disrupting includes means for preventing undesired signals from being transmitted from said input port to said output port.

9. A bandpass filter in accordance with claim 1, wherein said means for disrupting includes tunable means for varying said second set of frequencies.

10. A bandpass filter in accordance with claim 9, wherein said tunable means includes varactor diode means whose capacitance may be controllably varied to vary said second set of frequencies.

11. A bandpass filter in accordance with claim 9, wherein said tunable means include a pair of varactor diodes whose cathodes are coupled.

12. A bandpass filter in accordance with claim 9 further including control voltage means coupled to said tunable means for controlling said second set of frequencies by varying a tuning voltage applied to said tunable means.

13. A filter comprising:
    an input port for receiving signals within a predetermined and of frequencies;
    an output port;
    isolating means, coupled between said input port and said output port, for isolating said input port from said output port such that no output signal is generated at said output port in response to input signals having a first set of frequencies within said predetermined band of frequencies; and
    means, coupled to said means for isolating, for disrupting said isolation in response to input signals having a second set of frequencies which are within said predetermined band of frequencies, whereby signals within said second set of frequencies are passed to said output port.

14. A filter according to claim 13, wherein said means for isolating includes resistive bridge means for blocking the generation of output signals in response to input signals having said first set of frequencies.

15. A filter in accordance with claim 14, wherein said resistive bridge means includes a plurality of resistors and filter means, coupled across one of said resistors, said filter means presenting substantially a short circuit across said resistor at said second set of frequencies.

16. A filter in accordance with claim 15, wherein the resistor across which said filter means is disposed is substantially greater than any of the other resistors in said resistive bridge means.

17. A filter in accordance with claim 15, wherein said filter means is operable to unbalance said resistive bridge means at said second set of frequencies and includes a notch filter.

18. A filter in accordance with claim 17 wherein said second set of frequencies is determined by a control voltage applied to said filter means.

19. In a superheterodyne radio receiver having an antenna for receiving radio frequency signals, front-end preselector means for filtering undesired signals, and mixer means coupled to said preselector means, for mixing the output of said preselector means with a local oscillator frequency, said preselector means having a bandpass filter, said bandpass filter comprising:

an input port for receiving radio frequency signals from said antenna;

an output port for coupling a filter output signal to said mixer means;

isolating means, coupled between said input port and said output port, for preventing output signals from being passed to said mixer means if the radio frequency signals received from the antenna are outside a predetermined passband; and means, coupled to said means for isolating, for disrupting said isolation in response to radio frequency signals within said predetermined passband, whereby said radio frequency signals in said passband are coupled to said mixer means.

20. A bandpass filter according to claim 19, wherein said means for dilating includes a resistive bridge for blocking the passage of signals to said output port in response to input signals outside said passband.

21. A bandpass filter according to claim 19, wherein said means for disrupting said isolation includes a notch filter, coupled to said resistive bridge, for presenting a substantially short circuit to signals within said passband and for presenting a substantially open circuit to signals outside said passband.

22. A bandpass filter according to claim 21, wherein said notch filter includes means for varying said passband.

23. A bandpass filter according to claim 22, wherein said means for varying includes a pair of varactor diodes whose cathodes are interconnected.

24. In a superheterodyne radio receiver having an antenna for receiving radio frequency signals, front end preselector means for filtering undesired signals and mixer means, coupled to said preselector means, for mixing the output of said preselector means with a local oscillator frequency, a method of filtering radio frequency signals in said preselector means comprising the steps of:

receiving radio frequency signals at an input port;

isolating received radio frequency signals which are outside a predetermined passband via a means for isolating by preventing said signals from being coupled to said mixer;

disrupting the operation of said means for isolating in response to received signals within said predetermined passband; and coupling signals within said predetermined passband to said mixer.

25. A method according to claim 24, wherein said step of isolating includes the step of blocking the passage of signals outside of said predetermined passband with a balanced resistive bridge.

26. A method according to claim 24, further including the step of automatically varying said predetermined passband.

27. A method according to claim 24, wherein said step of disrupting includes the step of coupling a notch filter to said means for isolating to present substantially a short circuit to signals in said predetermined passband and substantially an open circuit to signals outside said passband.

28. A filter comprising:
an input port for receiving signals having a predetermined band of frequencies;
an output port;
a directive device having a further port and being coupled to said input port for receiving signals having said predetermined band of frequencies and for coupling signals having said predetermined band of frequencies to said further port and for passing signals in a predetermined passband to said output port; and
a circuit coupled to said further port for absorbing signals having frequencies in said predetermined band of frequencies except for a signal having a frequency in said passband.

29. A filter according to claim 28, wherein said directive device comprises a resistive bridge.

30. A filter according to claim 28, wherein said circuit is a notch filter.

* * * * *